LOW CAPACITANCE FIELD EFFECT TRANSISTOR

Filed Nov. 16, 1965

INVENTOR
RONALD L. KOEPP

BY Sughrue, Rothwell, Mion, Zinn & Macpeak

ATTORNEYS.

LOW CAPACITANCE FIELD EFFECT TRANSISTOR

INVENTOR
RONALD L. KOEPP

BY Sughrue, Rothwell, Mion, Zinn & Macpeak

ATTORNEYS.

United States Patent Office 3,443,172

Patented May 6, 1969

3,443,172

LOW CAPACITANCE FIELD EFFECT TRANSISTOR

Ronald L. Koepp, Creve Coeur, Mo., assignor to Monsanto Company, St. Louis, Mo., a corporation of Delaware Filed Nov. 16, 1965, Ser. No. 508,027
Int. Cl. H01l *11/14*
U.S. Cl. 317—235 12 Claims The invention relates to new and improved field effect transistors and more particularly to new and improved low capacitance field effect transistors having required size fo. handling, and methods of fabricating the same.

Figure 1:
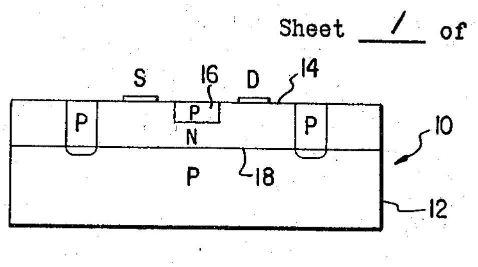
FIG. 1 PRIOR ART

Field effect transistors, often referred to as unipolar transistors because conduction is by a single carrier rather than by both majority and minority carriers as in other transistors, comprise, generally, a body of semiconductor material such as germanium or silicon having an ohmic connection, usually called a source, and another ohmic connection usually called a drain, at spaced positions on the body. The body itself is of one conductivity, either N or P, and the source and drain are relatively biased to cause a flow of majority carriers from the source to the drain. When the body is of N-type conductivity, the majority carriers are electrons and when the body is P-type, the majority carriers are holes.

Built into the body is a region or zone of conductivity type opposite that of the major portion of the body. This region is disposed adjacent the path of flow of the majority carriers from the source to the drain and is often referred to as the gate electrode. An ohmic connection, called the gate connection, is made to this region, and this connection is energized so that the PN junction between the gate region and the remainder of the body is biased in the reverse direction. Due to the reverse bias, a space charge region is generated adjacent the junction, the extent of this space charge region into the body being dependent upon the magnitude of the gate potential. The doping of the gate region is preferably higher than the doping of the main body to restrict the space charge region mostly to the main body.

Variations in the extent of the space charge region cause corresponding variations to appear in the cross sectional area of the path available for flow of majority carriers from source to drain. The gate may thus be used to control the flow of current to the drain by affecting a modulation of the resistance of the source-to-drain path.

Field effect transistors as is well known may be used in amplifiers and oscillators. Also, field effect transistors may be used in logic circuits as high speed switches. However, the relatively high inherent capacitance of prior art field effect transistors has prevented their widespread use by circuit designers in high quality frequency circuits, in counters, A.C. digital voltmeters, and other instruments. The major contribution to the high capacitance in the field effect transistors has been the large PN junction which exists between the bottom gate and the body of the field effect transistor. Although the bottom gate forming the PN junction is relatively large, most of the area does not contribute to the device performance but is only there because a certain size is needed for handling. Thus, merely decreasing the geometry of the overall device does not offer a solution because although the capacitance would be reduced, the device itself would not be large enough for handling.

The present invention overcomes the above-mentioned difficulty by a method of fabrication which results in a very small back gate that is buried into the overall field effect transistor.

It is therefore an object of the present invention to provide a new and improved field effect transistor having relatively low capacitance.

A further object of the present invention is to provide a new and improved method for fabricating field effect transistors.

The foregoing and other objects, features and advantages of the invention will be apparent from the following more particular description of a preferred embodiment of the invention, as illustrated in the accompanying drawings, wherein FIGURE 1 is a side view of a prior art field effect transistor, and FIGURES 2 through 9 are views illustrating several stages in the fabrication of the field effect transistor of the present invention.

A typical prior art field effect transistor 10, as shown in FIGURE 1, has source and drain electrodes S and D respectively, a bottom gate 12 and a top gate 16. Current flow in the field transistor 10 is between the source and drain through the N-type layer 14. The capacitance of the field effect transistor depends upon the physical size of the device and therefore can be made small by decreasing the device geometry. However, the major contribution to capacitance is the large N-layer to P substrate area, most of which does not contribute to the device performance but is only there because a certain size is necessary for handling. Consequently, although reducing the overall geometry of the device 10, will reduce the area of junction 18 and thereby reduce the device capacitance, the P-layer 12 which serves both as the back gate and the substrate will become too small for handling.

In the present invention, the junction between the back gate is made very small without the sacrifice of overall device geometry. The method for fabricating the field effect transistor of the present invention will be explained with reference to FIGURES 2–9, which illustrate different stages in the development of the final product.

Before commencing a description of the new method, it should be understood that the materials referred to are not critical and in themselves form no part of the present invention. For example, although the description will be explained with reference to a silicon field effect transistor having an N-type body and P-type gates, the invention pertains equally as well to silicon field effect transistors having P-type bodies and N-type gates, and also to field effect transistors made from other types of semiconductor material. Also, the impurity used to form the diffused junctions is a matter of engineering choice and it is not critical that boron be used, as described in the method below. For ease of explaining and understanding the present invention, the making of only a single field effect transistor will be described. However, it will be apparent to those skilled in the art, that a plurality of field effect transistors may be made simultaneously from a large substrate by the techniques to be described below, followed by separation of the individual transistors by methods well known in the transistor manufacturing art.

Figure 2B:
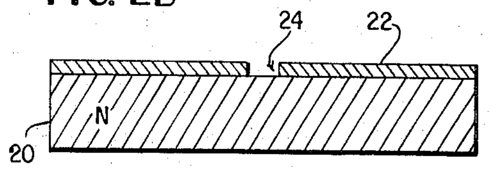
Figure 2A:
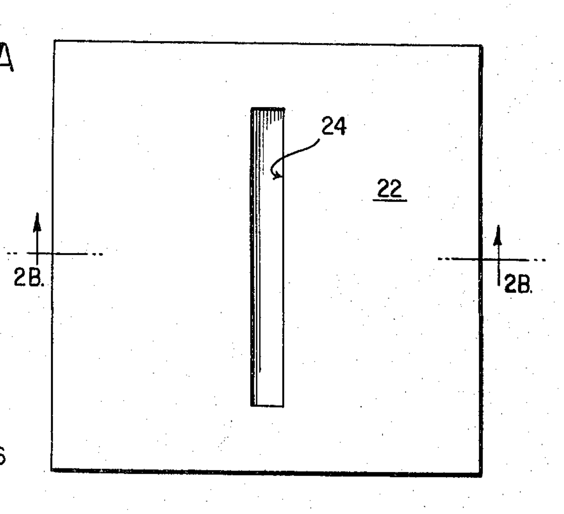

Referring to FIGURE 2 there is shown a layer of N-type silicon which is the starting material and which will serve as the body of the finished field effect transistor. The silicon semiconductor layer 20 is polished and then exposed to an oxygen atmosphere for the formation of a thin oxide layer on the upper surface thereof.

As an example, the N-type silicon may be placed in a tube type furnace at 1200° C., and an atmosphere of wet oxygen passed over it for three hours. An oxide thickness of about 4000–7000 A. will be produced on the wafers. Other methods for producing an oxide coating on the upper surface of a semiconductor wafer are well known and will not be discussed herein.

A channel 24 is cut into the oxide layer 22 thereby exposing a thin strip area of the semiconductor upper surface. The removal of the oxide from the desired surface area may be accomplished by numerous methods, well known in the art. A preferred method is to coat the oxide surface with any one of a group of well known photo-resist materials. Conventional methods of applying such a coating may be employed such as brushing, dipping, spraying, or the like which may be followed by a whirling operation to insure uniform and thin resist layers. It is important, that before applying a resist material, a suitable cleaning agent such as benzene, toluene, or like solvents are used to insure a clean surface. The resist is then removed in part over the desired area of the oxide by applying photographically a pattern to the resist surface and developing the same by means well known in the art. The development thus removes the resist from the desired areas exposing portions of the oxide, and the exposed oxide may then be removed from the upper surface of the semiconductor substrate by the use of a suitable etchant, e.g. solutions of ammonium bifluoride.

The remaining resist may be removed by any number of suitable solvents, e.g. cellulose acetate, leaving an oxide mask 22 over the upper surface of the semiconductor substrate, as shown in FIGURE 2.

Figure 3B:
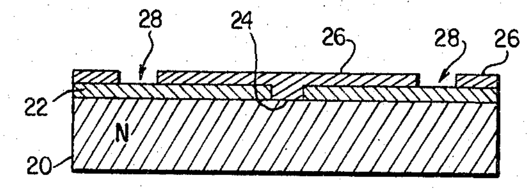
Figure 3A:
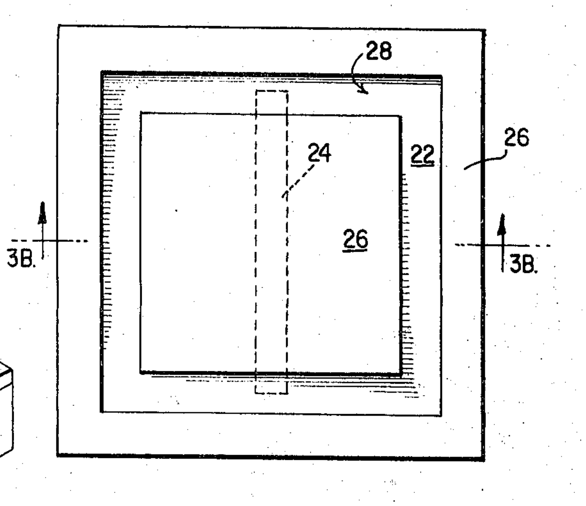
Figure 4:
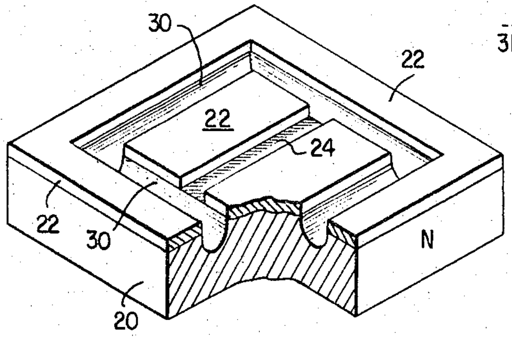
Figure 5:
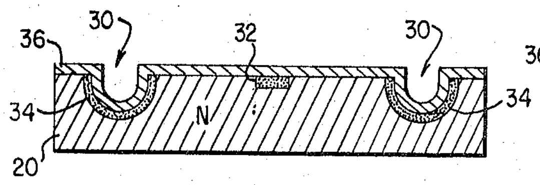

The next step in the process of fabrication is to form a groove in the semiconductor substrate which surrounds the area 24. An intermediate step in forming the groove is shown in FIGURE 3 wherein a mask 26 of photo-resist material overlies oxide layer 22. The photo-resist material has been removed, as indicated in FIGURE 3, from areas, 28, by methods such as those described above. The grooves are formed by applying an etchant solution to the upper surface of the device shown in FIGURE 3B. The portions covered by the photo-resist are protected from the etchant solution, but the unprotected areas are in effect scooped out forming a U-shaped groove having a surface geometry corresponding to area 28. The etchant may be a solution of three parts nitric acid to one part hydrofluoric acid to produce grooves of approximately 0.5 mil. The photo-resist coating 26 is then removed, leaving an oxide coating 22 in the form of a mask covering all of the semiconductor surface except the strip area 24 and the grooves 30, as shown by the sectional perspective drawing of FIGURE 4.

After the latter step, the device is ready for formation of the bottom P-type gate. The P-type sections are formed by vapor diffusion through the upper surface areas left unprotected by the oxide coating, as is well known in the art. A typical method is to place the device in a tube furnace at about 1200° C., and subject it to an atmosphere of boron for about 10 minutes. This produces a shallow lightly doped P-type junction such as that shown by 32 and 34 in FIGURE 5. The diffused P-type section 32 has a surface geometry which is substantially identical to that of channel 24, and will serve as the bottom gate for the completed field effect transistor.

After the latter diffusion, the entire upper surface including the inside surface of the grooves 30 is again covered by an oxide layer. As a typical example, the oxide layer may be formed by placing the device in an oxidizing atmosphere of steam at 1100° C. to produce an oxide layer of about 8000–10,000 A.

Figure 6:
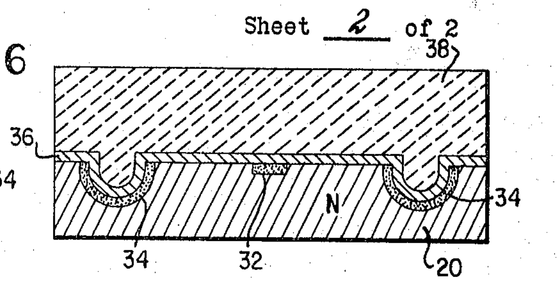

A deposition of polycrystalline silicon, about 5 to 6 mils thick, over the oxide layer follows, forming the structural layer 38 shown in FIGURE 6. The purpose of the structural layer 38 is to provide the size necessary for handling of the completed device. Methods for depositing polycrystalline silicon are well known in the art. One typical method comprises placing the device in a reaction chamber which consists of a long cylindrical quartz tube with inlet and outlet at opposite ends. An RF induction coil encircles the cylindrical tube and a long rectangular graphite rod (called a boat) is placed within the reaction chamber, where the graphite can be heated inductively to about 1200° C. The boat is encased by a quartz sleeve upon which the wafers which are to receive the silicon deposition are placed. A wide variety of gases, such as $N_2$, $H_2$, $H_2+SiCl_4$, $H_2+PH_3H_2+B_2H_6$, and HCl, are introduced into the chamber by means of a branched inlet. The basic chemical reaction for the production of the polycrystalline silicon is the hydrogen reduction of silicon tetrachloride:

$$SiCl_4 + 2H_2 \overset{1200^\circ \text{ C.}}{\rightleftarrows} Si + 4HCl$$

Figure 7:
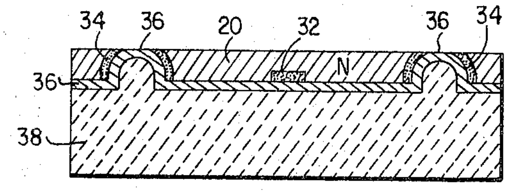
Figure 8B:
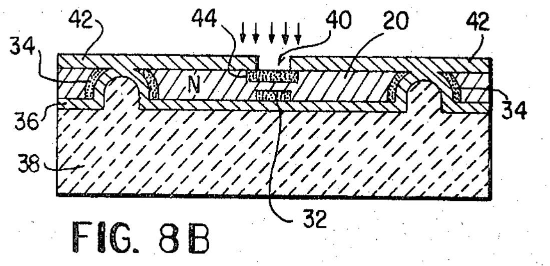

The device is then turned over, as shown in FIGURE 7, and the upper surface of the N-type silicon layer is lapped and polished until the oxide 36 at the apex of the U-shaped groove is exposed to the surface. The oxide 36 at the upper surface completely surrounds the surface area of semiconductor 20. The upper P-type gate is then formed by methods similar to that described above. For example, an oxide coating is placed over the upper surface of the device and removed from desired areas forming a pattern 40, shown in FIGURE 8, by photoetching techniques. The upper P-type gate 44 is formed by diffusing an impurity through the surface areas of the semiconductor, 20, left unprotected by the oxide layer 42. Typically, the P-type upper gate may be formed by subjecting the device to a boron atmosphere at 1,023° C.

Figure 9A:
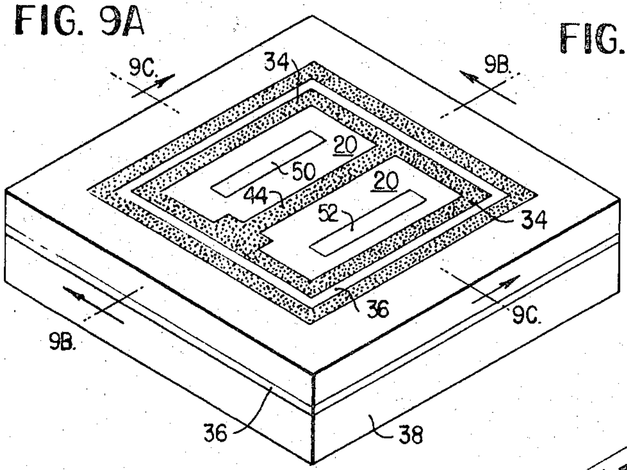
Figure 8A:
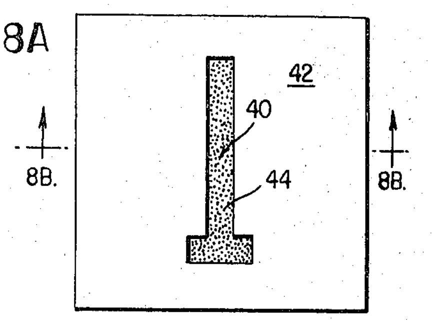
Figure 9C:
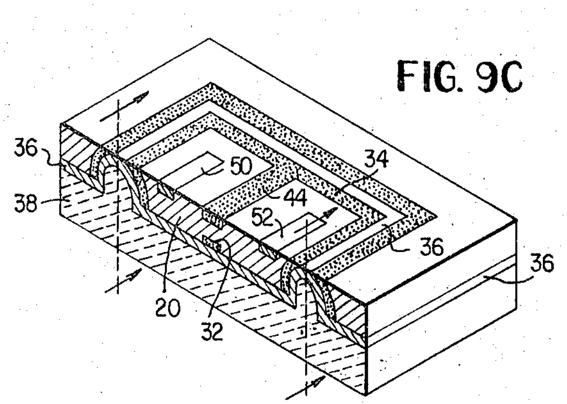
Figure 9B:
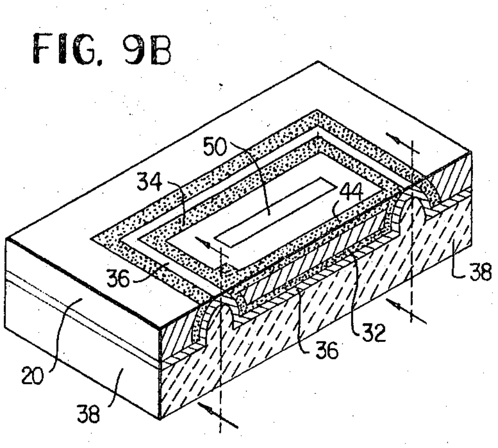

The shape of the upper P gate 44 as shown in FIGURES 9A through 9C is that of a very narrow strip with a widened portion at one end. In the fabrication of field effect transistors it is desirable to provide such a narrow, strip-like upper gate but external electrical contact to such a narrow strip is not practical. However, the wider portion at one end of the gate 44 does provide sufficient contact area. It should be noted that when formation is complete, the upper P-type gate 44 and the lower P-type gate 32 are connected together at their ends by the P-type zone 34. Thus, electrical continuity is provided between the upper and lower P-type gates, and it is only necessary to provide an external contact to the upper gate 44. However, it should be noted that separate control for each gate may be employed where electrical continuity between them is broken and this may easily be done by providing separate contacts for each gate.

The function of the P-type regions 34, which are formed integrally with the bottom gate 32, aside from providing electrical continuity between the upper and lower gates, is to isolate the N-type channel, which is the current conducting path of the FET, from other active elements which are or may be fabricated adjacent to the field effect transistor on the same substrate. Their control function when compared with that of the lower gate 32, is insignificant.

After the upper P-type gate 44 is formed, the oxide coating 42 is removed to allow the formation of the contacts 50 and 52, shown in FIGURES 9A through 9C, which serve as the source and drain electrodes respectively.

Several different contact materials may be used; e.g., gold, nickel, lead, silver, or chromium. However, aluminum contacts are preferable. After the oxide coating 42 has been removed by the conventional photo-resist technique in those areas where only contacts are to be formed, the contact areas are cleaned and the wafer placed in a high-vacuum bell-jar system. The clean, etched wafers are placed under a tungsten filament in the bell-jar and the ohmic-contact metal, e.g., aluminum, is coiled around the tungsten filament. After the bell-jar has been evacuated, the aluminum is vaporized by the heated filament and deposited in a thin film on the wafer. The bell-jar is then backfilled and the wafer removed. The metalized wafer is then coated or masked with photo-resist, exposed with a new mask which is essentially the inverse of the preceding mask, and developed. At this point, an appropriate etch such as sodium hydroxide or a solution of 20% KOH is used to remove the aluminum from the unwanted areas. The photo-resist is then cleaned from the deposited aluminum and the metal alloyed into the surface of the semiconducted material by heating.

The resulting field effect transistor, which is shown in FIGURES 9A through 9C has a very small gate-body junction area resulting in a substantially reduced transistor capacitance. At the same time, a substrate 38 which has no effect on the device capacity gives the overall device sufficient size for handling capabilities. In actual practice, if a plurality of field effect transistors are made simultaneously from a large substrate, in accordance with the method described above, the individual field effect transistors would be separated by slicing along the apex of the U-shaped groove as indicated by the dotted lines in FIGURES 9C and 9B.

While the invention has been particularly shown and described with reference to a preferred embodiment thereof, it will be understood by those skilled in the art that various changes in form and details may be made therein without departing from the spirit and scope of the invention.

What is claimed is:

1. A low capacitance field transistor unit comprising,
(a) a layer of polysilicon having inwardly sloping edges in its upper portion, said edges surrounding a substantially flat plateau forming the upper surface of said polysilicon layer,
(b) a silicon dioxide coating covering the edges and plateau of said polysilicon,
(c) a silicon semiconductor covering said coating and having an upper plane which intersects the top of the silicon dioxide coating covering the top of said edges,
(d) a small thickness of P-type conductivity in said semiconductor adjacent to the silicon dioxide covering said edges,
(e) a first channel of P-type conductivity in said semiconductor lying on the silicon dioxide coating over the plateau and extending to the small thickness of P-type conductivity in opposite sides of the plateau,
(f) a second channel of P-type conductivity in said semiconductor being substantially parallel with said first channel and overlying but not touching same, said second channel having an upper surface flush with the surface of said semiconductor and having a length which extends to said small thickness on opposite sides of said plateau, said semiconductor other than said small thickness and said first and second channels being of N-type conductivity,
(g) first and second metal contacts ohmically connected to said semiconductor surface on opposite sides of said upper channel, and
(h) an ohmic contact connected to said second channel.

2. A field effect transistor unit comprising,
(a) a layer of supporting material for supporting the active portion of said field effect transistor, said layer having inwardly sloping edges on the upper portion thereof, the lowermost part of said edges defining the perimeter of a plateau forming the upper surface of said layer,
(b) an electrically insulating oxide coating covering the edges and the upper surface of said layer,
(c) a semiconductor material filling in said plateau and forming the upper surface of said transistor at a plane which intersects the oxide coating covering the topmost portions of said edges,
(d) a small thickness of a first type conductivity in said semiconductor adjacent the oxide covering said edges, (e) a first channel of first type conductivity in said semiconductor lying on the oxide coating over the plateau and extending to said small thickness on opposite sides of the plateau,
(f) a second channel of a first type conductivity in said semiconductor being substantially parallel with said first channel and overlying but not touching said first channel, said second channel having an upper surface flush with the surface of said transistor and having a length which extends to said small thickness on opposite sides of said plateau, said semiconductor portions other than said small thickness and said first and second channels being of a conductivity type opposite to said first type conductivity.

3. A field effect transistor as claimed in claim 2 wherein said semiconductor is silicon and said oxide is silicon dioxide.

4. A field effect transistor as claimed in claim 3 wherein said first type conductivity is N-type.

5. A field effect transistor as claimed in claim 3 wherein said first type conductivity is P-type.

6. A field effect transistor as claimed in claim 4 wherein said supporting material is polycrystalline silicon.

7. A field effect transistor as claimed in claim 5 wherein said supporting material is polycrystalline silicon.

8. A field effect transistor as claimed in claim 6 further comprising first and second metal contacts ohmically connected to the upper surface of said semiconductor on opposite sides of said second channel respectively, and an ohmic connection to said second channel.

9. A field effect transistor as claimed in claim 7 further comprising first and second metal contacts ohmically connected to the upper surface of said semiconductor on opposite sides of said second channel respectively, and an ohmic connection to said second channel.

10. A field effect transistor as claimed in claim 2 further comprising first and second metal contacts ohmically connected to the upper surface of said semiconductor on opposite sides of said second channel respectively, and an ohmic connection to said second channel.

11. A field effect transistor as claimed in claim 10 wherein said semiconductor is germanium and said first type conductivity is P-type.

12. A field effect transistor as claimed in claim 10 wherein said semiconductor is germanium and said first type conductivity is N-type.

References Cited

UNITED STATES PATENTS

| | | | |
|---|---|---|---|
| 2,899,344 | 8/1959 | Atallu | 148—1.5 |
| 3,290,753 | 12/1966 | Chang | 29—25.3 |
| 3,344,322 | 9/1967 | Dill | 317—235 |
| 3,349,300 | 10/1967 | Koepp | 317—235 |
| 3,358,195 | 12/1967 | Onodera | 317—234 |
| 3,381,187 | 4/1968 | Zuleeg | 317—235 |
| 3,372,316 | 3/1968 | Teszner | 317—235 |

JOHN W. HUCKERT, *Primary Examiner.*

M. EDLOW, *Assistant Examiner.*

U.S. Cl. X.R.

307—304; 317—234